United States Patent
Shih et al.

(10) Patent No.: US 9,475,272 B2
(45) Date of Patent: Oct. 25, 2016

(54) DE-BONDING AND CLEANING PROCESS AND SYSTEM

(71) Applicant: Taiwan Semiconductor Manufacturing Company, Ltd., Hsin-Chu (TW)

(72) Inventors: Ying-Ching Shih, Taipei (TW); Jing-Cheng Lin, Chu Tung Zhen (TW); Szu Wei Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/511,010

(22) Filed: Oct. 9, 2014

(65) Prior Publication Data

US 2016/0101613 A1    Apr. 14, 2016

(51) Int. Cl.
*B32B 38/10* (2006.01)
*B32B 43/00* (2006.01)
*B32B 38/16* (2006.01)
(Continued)

(52) U.S. Cl.
CPC .......... *B32B 43/006* (2013.01); *B32B 38/162* (2013.01); *B32B 38/10* (2013.01); *B32B 38/1858* (2013.01); *B32B 2310/0825* (2013.01); *B32B 2310/0831* (2013.01); *B32B 2310/0843* (2013.01); *H01L 21/02076* (2013.01); *H01L 21/02096* (2013.01); *Y10S 901/40* (2013.01); *Y10S 901/43* (2013.01);
(Continued)

(58) Field of Classification Search
CPC . B32B 38/10; B32B 43/006; Y10T 56/1111; Y10T 56/1158; Y10T 56/1917; Y10T 56/1928; H10L 21/02076; H01L 21/02096; H01L 21/02098

USPC ....... 156/703, 712, 753, 755, 930, 931, 941, 156/942
See application file for complete search history.

(56) References Cited

U.S. PATENT DOCUMENTS

| | | | | |
|---|---|---|---|---|
| 5,518,542 A | * | 5/1996 | Matsukawa | B08B 1/007 118/232 |
| 2005/0007571 A1 | * | 1/2005 | Yamamoto | H01L 21/67028 355/30 |

(Continued)

FOREIGN PATENT DOCUMENTS

| | | |
|---|---|---|
| JP | 2001023954 | 1/2001 |
| JP | 2013135181 A | 7/2013 |

(Continued)

*Primary Examiner* — Mark A Osele
*Assistant Examiner* — Nickolas Harm
(74) *Attorney, Agent, or Firm* — Slater Matsil, LLP

(57) ABSTRACT

Methods and tools for de-bonding and cleaning substrates are disclosed. A method includes de-bonding a surface of a first substrate from a second substrate, and after de-bonding, cleaning the surface of the first substrate. The cleaning comprises physically contacting a cleaning mechanism to the surface of the first substrate. A tool includes a de-bonding module and a cleaning module. The de-bonding module comprises a first chuck, a radiation source configured to emit radiation toward the first chuck, and a first robot arm having a vacuum system. The vacuum system is configured to secure and remove a substrate from the first chuck. The cleaning module comprises a second chuck, a spray nozzle configured to spray a fluid toward the second chuck, and a second robot arm having a cleaning device configured to physically contact the cleaning device to a substrate on the second chuck.

20 Claims, 11 Drawing Sheets

(51) Int. Cl.
    *H01L 21/02*    (2006.01)
    *B32B 38/18*    (2006.01)
(52) U.S. Cl.
    CPC ..... *Y10T 156/1111* (2015.01); *Y10T 156/1158* (2015.01); *Y10T 156/1917* (2015.01); *Y10T 156/1928* (2015.01)

(56) References Cited

U.S. PATENT DOCUMENTS

| | | | | |
|---|---|---|---|---|
| 2007/0020918 A1* | 1/2007 | Hirokawa | ............... | B23H 5/08 438/626 |
| 2008/0176002 A1* | 7/2008 | Tsutsumi | ............... | C23C 26/00 427/496 |
| 2008/0314870 A1* | 12/2008 | Inoue | ............... | B08B 1/04 216/38 |
| 2009/0314438 A1* | 12/2009 | Iwata | ............... | H01L 21/02057 156/753 |
| 2010/0038035 A1* | 2/2010 | Noda | ............... | B32B 43/006 156/379.6 |
| 2010/0263794 A1* | 10/2010 | George | ............... | H01L 21/67092 156/707 |
| 2010/0330788 A1* | 12/2010 | Yu | ............... | H01L 21/187 438/514 |
| 2011/0048630 A1* | 3/2011 | Hase | ............... | H01L 21/67132 156/272.2 |
| 2011/0165823 A1* | 7/2011 | Ide | ............... | B24B 37/00 451/41 |
| 2013/0084459 A1* | 4/2013 | Larson | ............... | C09J 4/00 428/422 |
| 2013/0133688 A1 | 5/2013 | Chiou et al. | | |
| 2013/0248119 A1* | 9/2013 | Hwang | ............... | H01L 21/67092 156/711 |
| 2013/0255720 A1* | 10/2013 | Tyrrell | ............... | A46B 7/04 134/6 |
| 2013/0312790 A1* | 11/2013 | Ishibashi | ............... | H01L 21/02041 134/6 |

FOREIGN PATENT DOCUMENTS

| KR | 20100059538 A | 6/2010 |
|---|---|---|
| KR | 20130053055 | 5/2013 |
| KR | 101435098 B1 | 8/2014 |

* cited by examiner

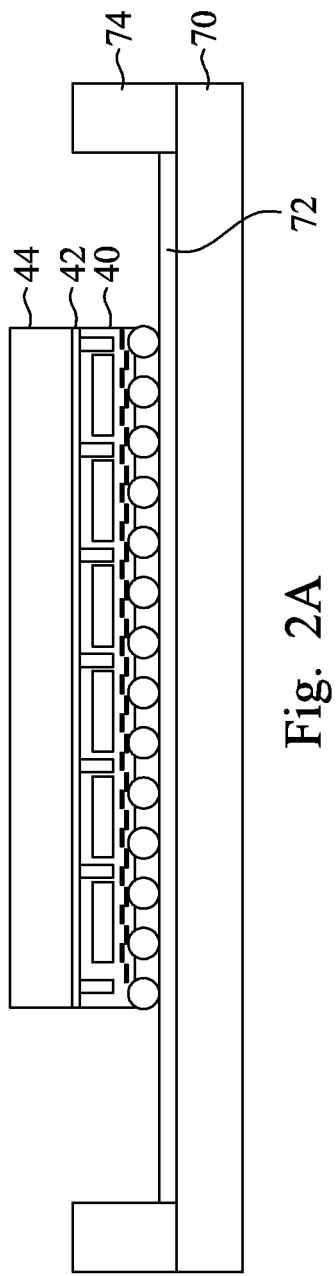
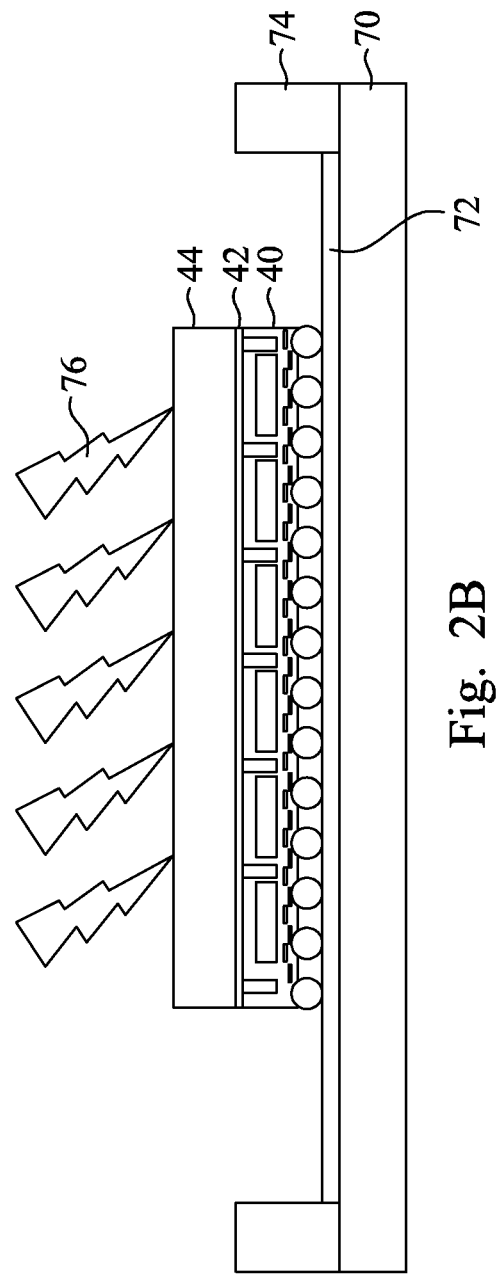

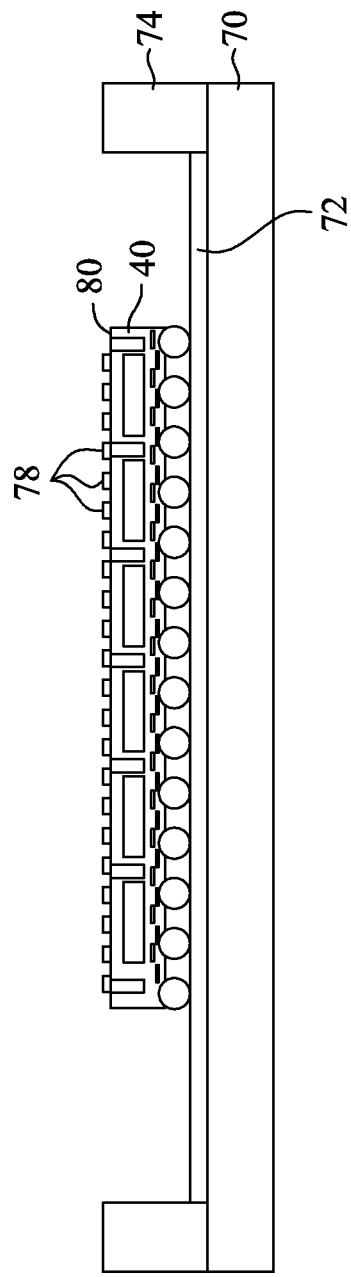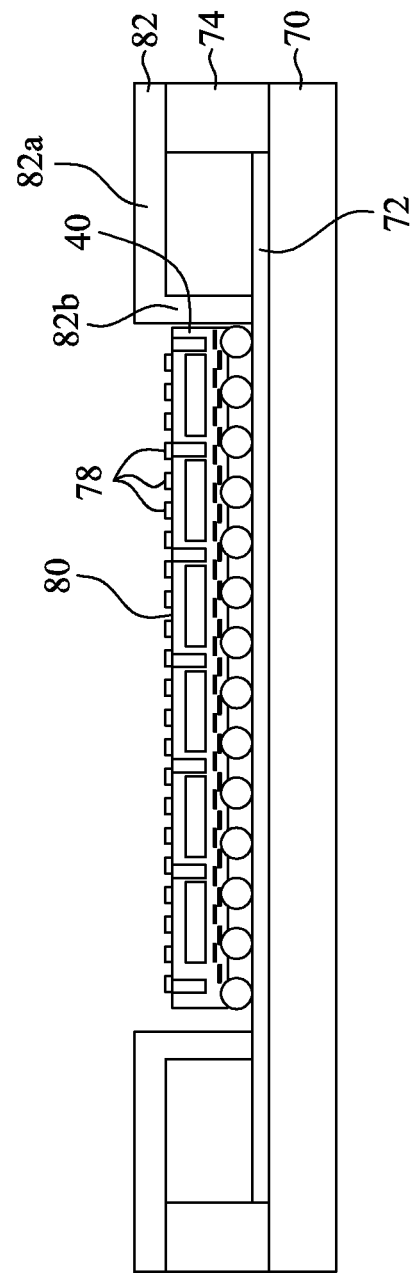

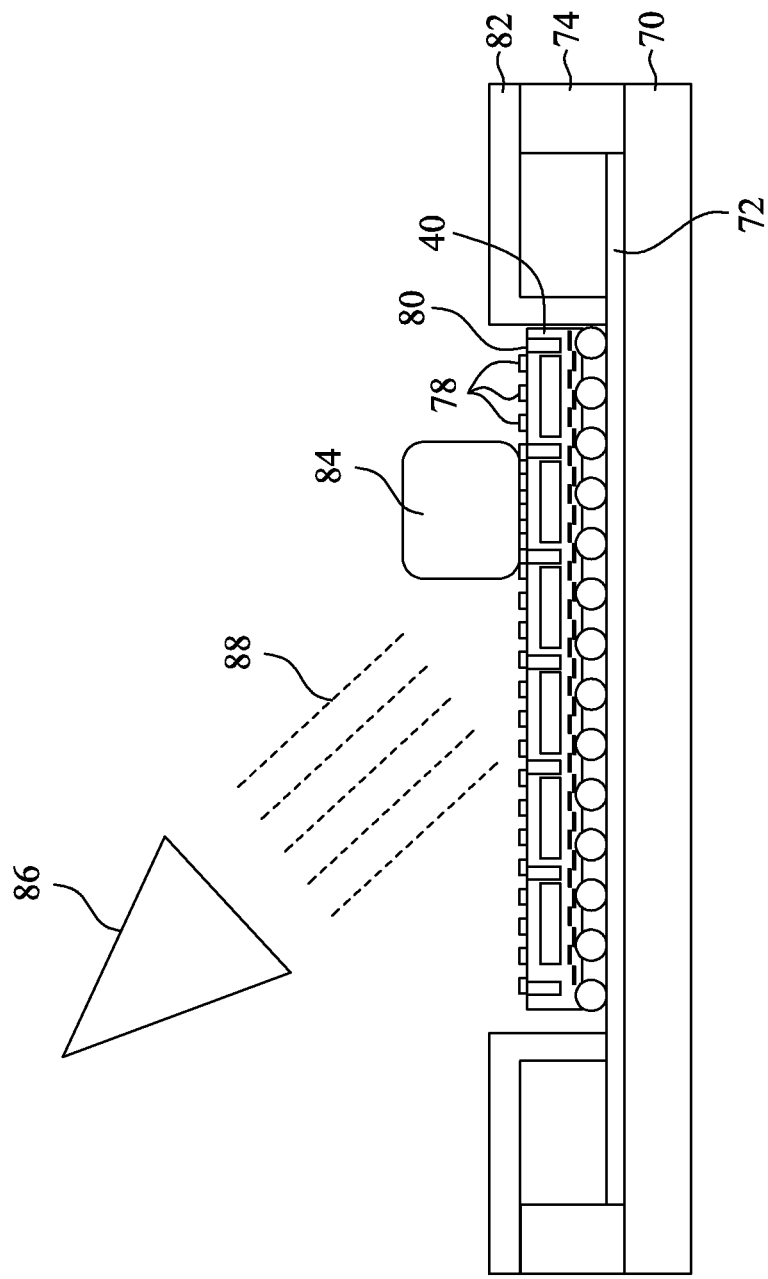

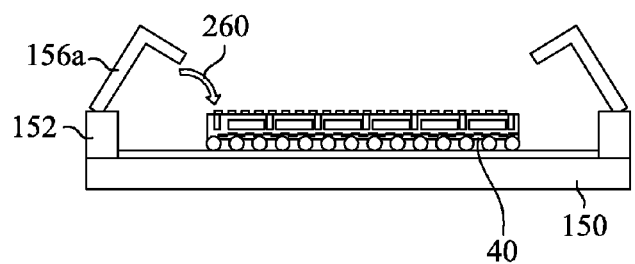
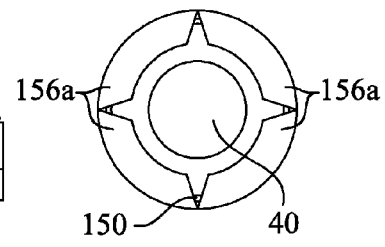
Fig. 6A    Fig. 6D
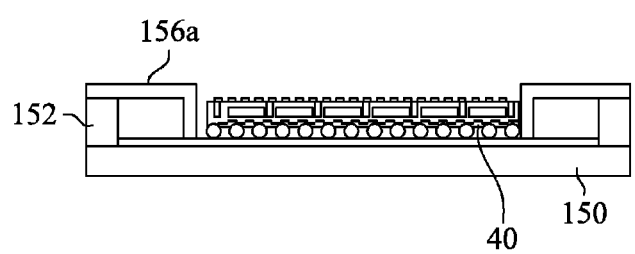
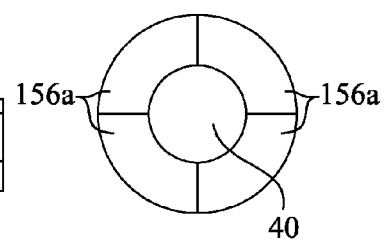
Fig. 6B    Fig. 6E
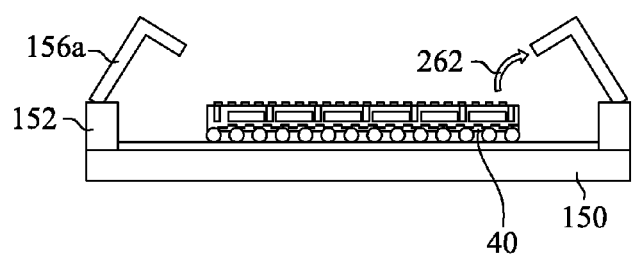
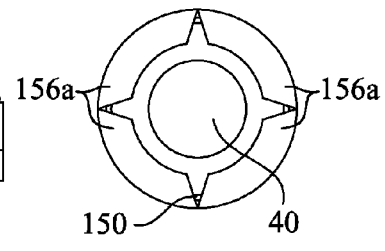
Fig. 6C    Fig. 6F

DE-BONDING AND CLEANING PROCESS AND SYSTEM

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

Coupled with this miniaturization of devices and improvements in integration density, the semiconductor industry has developed new packages and processes for integrated the semiconductor device into a consumer product. There are numerous processes for packaging these semiconductor devices resulting in numerous different package configurations. These packages can accommodate the reduced footprint of the semiconductor device with other components that may require, for example, larger electrical connections with greater pitch.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2G are a process for de-bonding a carrier substrate from a package substrate and cleaning the package substrate in accordance with some embodiments.

FIGS. 6A through 6F are views of another example configuration to place and remove a cover ring according to an embodiment.

DETAILED DESCRIPTION

Figure 1:
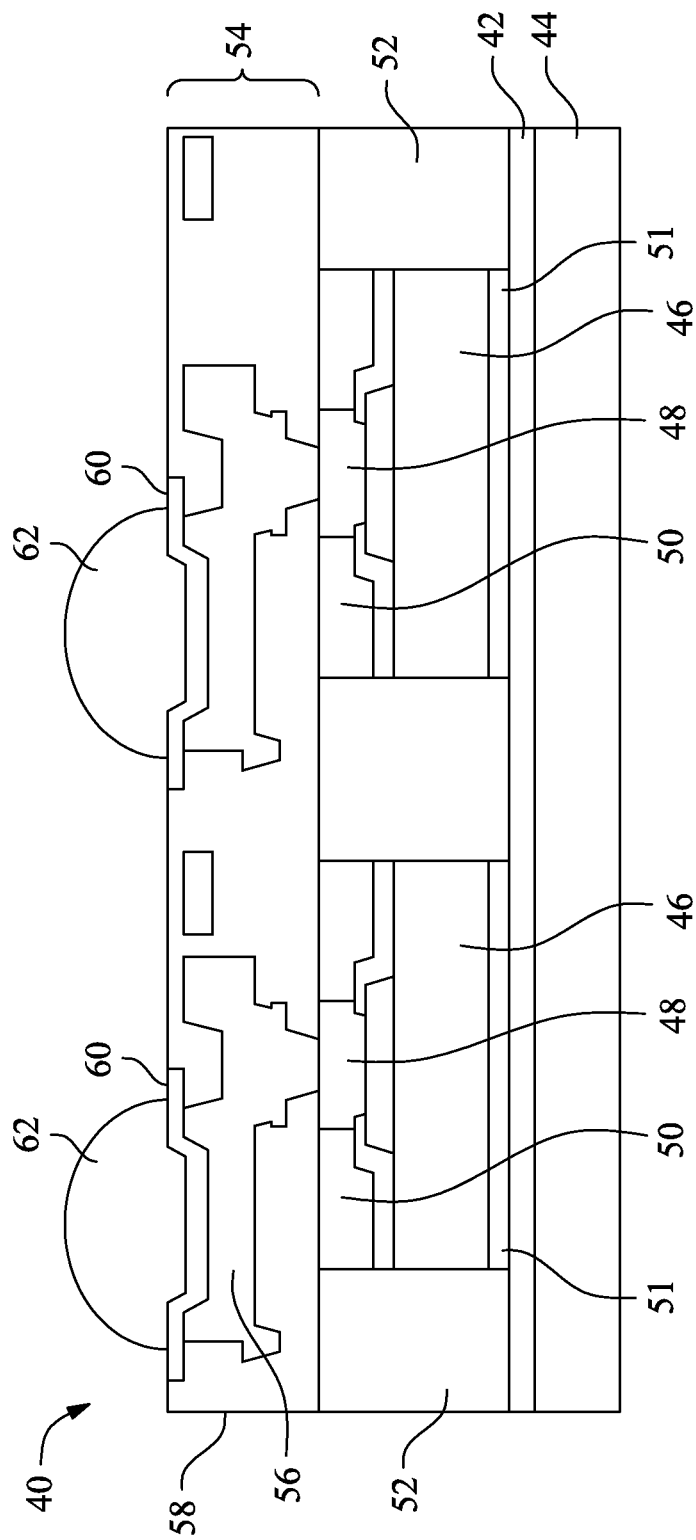
FIG. 1 is a cross sectional view of a simplified package substrate to which a de-bonding and cleaning process may be applied in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, process embodiments are discussed herein as being performed in a particular order; however, other embodiments contemplate that processes can be performed in any logical order.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are discussed below in a specific context, namely a de-bonding and cleaning process applied to a fan-out or fan-in wafer-level package. However, aspects of this disclosure may be applied in numerous other contexts, such as to any components that are bonded together with a release coating that are then subsequently de-bonded. Further, some modifications to processes and systems are discussed below, and one of ordinary skill in the art will readily understand additional modifications that can be applied. Embodiments contemplate these modifications.

FIG. 1 illustrates a cross sectional view of a simplified package substrate 40, such as a fan-out or fan-in wafer-level package, bonded to a carrier substrate 44 by a Light-to-Heat-Conversion (LTHC) release coating 42. A de-bonding and cleaning process discussed herein may be applied to this structure in FIG. 1, although embodiments contemplate various other packages, package substrates, and/or components.

The carrier substrate 44 may be a glass substrate, silicon substrate, aluminum oxide substrate, or the like, and may be a wafer. The LTHC release coating 42 is on the carrier substrate 44. The carrier substrate 44 provides temporary mechanical and structural support during processing steps to form the package substrate 40. The LTHC release coating 42 is formed on a surface of the carrier substrate 44. The LTHC release coating 42 is, for example, an oxide, a nitride, an organic material, the like, or a combination thereof, such as a polyimide-based material. The LTHC release coating 42 can be formed using lamination, spin coating, the like, or a combination thereof.

The package substrate 40 comprises one or more integrated circuit dies 46. The integrated circuit dies 46 each comprise a semiconductor substrate, such as silicon, doped or undoped, or an active layer of a semiconductor-on-insulator (SOI) substrate. The semiconductor substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

Die connectors 48, such as conductive pillars (for example, comprising a metal such as copper), are exterior to the integrated circuit dies 46 and are mechanically and electrically coupled to the respective integrated circuit dies 46 on what may be referred to as respective active sides of the integrated circuit dies 46. The die connectors 48 electrically couple the respective integrated circuits of the integrate circuit dies 46.

A dielectric material 50 is on the active sides of the integrated circuit dies 46. The dielectric material 50 laterally encapsulates the die connectors 48, which have upper surfaces that are co-planar with upper surfaces of the dielectric material 50, and the dielectric material 50 is laterally co-terminus with the respective integrated circuit dies 46. The dielectric material 50 may be a polymer such as polybenzoxazole (PBO), polyimide, benzocyclobutene (BCB), or the like; a nitride such as silicon nitride or the like; an oxide such as silicon oxide, PhosphoSilicate Glass (PSG), Boro-Silicate Glass (BSG), Boron-doped PhosphoSilicate Glass (BPSG), or the like; the like, or a combination thereof.

Back sides of the integrated circuit dies 46, or sides opposite from the active sides, are adhered to the LTHC release coating 42 on the carrier substrate 44 by an adhesive 51. The adhesive 51 may be any suitable adhesive, epoxy, or the like.

An encapsulant 52 at least laterally encapsulates the integrated circuit dies 46. The encapsulant 52 has a first surface that adjoins the LTHC release coating 42 and has a second surface that is co-planar with upper surfaces of the dielectric material 50 and the die connectors 48. The encapsulant 52 may be a molding compound, epoxy, or the like.

A redistribution structure 54 comprises one or more metallization pattern 56 in one or more dielectric layer 58. At least a portion of the one or more metallization pattern 56 is electrically coupled to the respective integrated circuits on the integrated circuit dies 46 through the respective die connectors 48. The one or metallization pattern 56 can comprise any of lines, vias, pads, the like, or a combination thereof, and may comprise a conductive material, such as a metal, like copper, titanium, tungsten, aluminum, or the like. The one or more dielectric layer 58 may be a polymer such as PBO, polyimide, BCB, or the like; a nitride such as silicon nitride or the like; an oxide such as silicon oxide, PSG, BSG, BPSG, or the like; the like; or a combination thereof.

The one or more metallization pattern 56 comprises an under-metal 60 exposed on the redistribution structure 54. An external connector 62, such as a solder ball like a ball grid array (BGA) ball, is on the under-metal 60. In some embodiments, the external connector 62 comprises solder, such as a Sn—Ag alloy, a Sn—Ag—Cu alloy, or the like, and may be lead-free or lead-containing.

In the configuration in FIG. 1, the package substrate 40 comprises unsingulated packages. The package substrate 40 may comprise any number of packages. The package substrate 40 is formed and processed on the carrier substrate 44, which may be a wafer. As noted above, the package substrate 40 can have various modifications or configurations, and FIG. 1 is merely an example. Other package substrates may be used.

Figure 2F:
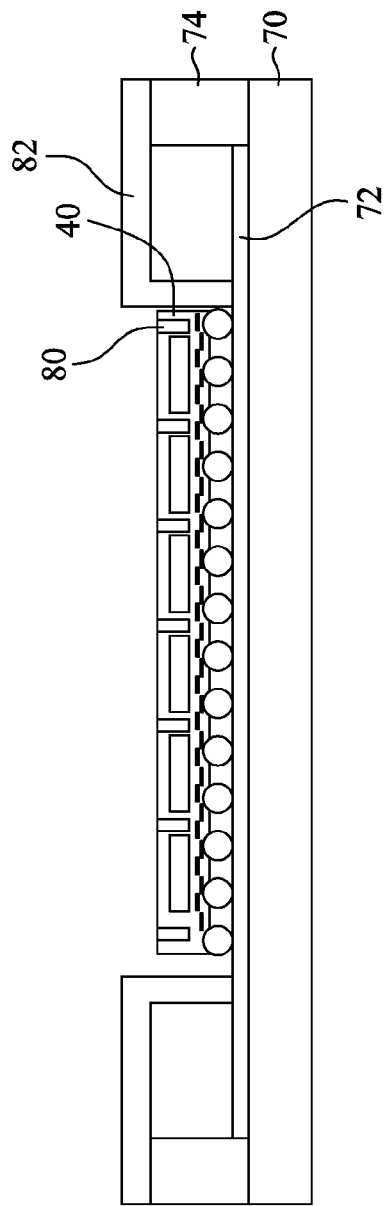

FIGS. 2A through 2G illustrate a process for de-bonding a carrier substrate 44 from a package substrate 40 and cleaning the package substrate 40 in accordance with some embodiments. In FIG. 2A, the package substrate 40 that is bonded to the carrier substrate 44 by the LTHC release coating 42 is mounted on a chuck 70 and within a frame 74 using a tape 72. The package substrate 40 is mounted on the tape 72 such that the carrier substrate 44 is upwards away from the chuck 70, such as, for example, the external connectors 62 of the package substrate 40 being adhered to the tape 72.

In FIG. 2B, a de-bonding process is performed. A radiation exposure 76 scans through the carrier substrate 44 to at least the LTHC release coating 42. When the radiation exposure 76 impinges upon the LTHC release coating 42, the LTHC release coating 42 decomposes, thereby de-bonding the carrier substrate 44 from the package substrate 40. In some embodiments, the radiation exposure 76 is a laser scan, a single wide-area exposure, or any other exposure, and may use infrared (IR) light, ultraviolet (UV) light, or the like. The details of the radiation exposure 76 may depend on the material used for the release coating. For example, UV light may be used when the release coating is a UV glue. Any acceptable de-bonding process may be used to decompose the release coating between the package substrate 40 and the carrier substrate 44. After de-bonding, the carrier substrate 44 is removed, and as illustrated in FIG. 2C, residue 78 of the LTHC release coating 42 may remain on a surface 80 of the package substrate 40.

In FIG. 2D, a cover ring 82 is placed over the frame 74 and contacts the tape 72. Although illustrated on chuck 70, the package substrate 40 may be transferred to another module with a different chuck, or may be subsequently processed on the same chuck 70 in the same module, as discussed in more detail below. Hence, subsequent discussion of the process may occur in a same module (e.g., with a same chuck) as the foregoing steps, or may be performed in a different module (e.g., with a different chuck).

The cover ring 82 covers the frame 74 and exterior portions of the tape 72 that do not directly underlie the package substrate 40. The cover ring 82 encircles the package substrate 40. The cover ring 82 may contact the tape 72 to form an impermeable or semi-impermeable seal, which may prevent particle contamination on the tape 72. As illustrated, the cover ring 82 comprises a flange portion 82a and an extending portion 82b. The flange portion 82a is secured to the frame 74 and is substantially in a plane parallel to the tape 72. The extending portion 82b extends from the flange portion 82a and contacts the tape 72. The extending portion 82b encircles lateral sides of the package substrate 40. A gap may be between the extending portion 82b and the lateral sides of the package substrate 40. The cover ring 82 illustrated in these figures is merely an example, and a cover ring may have many modifications.

In FIG. 2E, a cleaning device 84 contacts the surface 80 of the package substrate 40 to remove residue 78 from the surface 80. The cleaning device 84 can be a brush, a sponge, the like, or a combination thereof. A brush may include a base and bristles attached to the base. The bristles may be a flexible, comb-like configuration of material. Exemplary materials include polyvinyl acetate (PVA), mohair, sponge, fibers, cloth, nylon, rayon, polyester, polymer, or the like. A sponge may comprise a PVA sponge or the like. The cleaning device 84 passes over and in contact with the surface 80 to physically remove the residue 78 from the surface. A cleaning mechanism does not include mere use of chemicals and does not include mere use of a chemical mechanical polishing (CMP) process and tool.

A fluid 88 is sprayed from a spray nozzle 86. The fluid 88 may rinse the surface 80 as the cleaning device 84 passes over the surface 80. Thus, the fluid 88 may assist in removing residue 78 and particulates from the surface 80. The fluid 88 may be de-ionized (DI) water, isopropyl alcohol (IPA), a combination thereof, or the like. The cleaning device 84 may pass over and in contact with the surface 80 any number of times to sufficiently remove the residue 78.

Figure 2G:
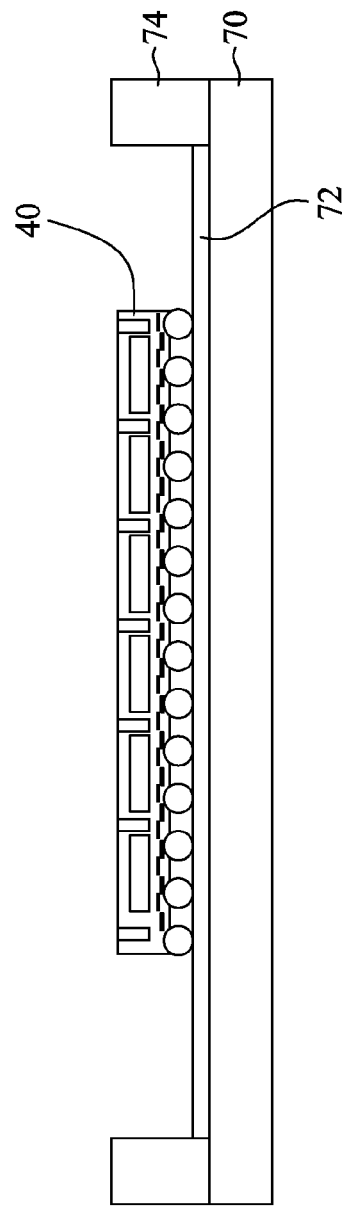

In FIG. 2F, the surface 80 of the package substrate 40 is shown to be free of particulates and residue 78, which includes substantially all particulates and residue being removed from the surface 80. In FIG. 2G, the cover ring 82 is removed, and the package substrate 40 is subsequently transferred back to a frame cassette. Subsequently, the package substrate 40 is diced or sawed to singulate individual packages that were formed in the package substrate 40.

Figures 3A, 3B:
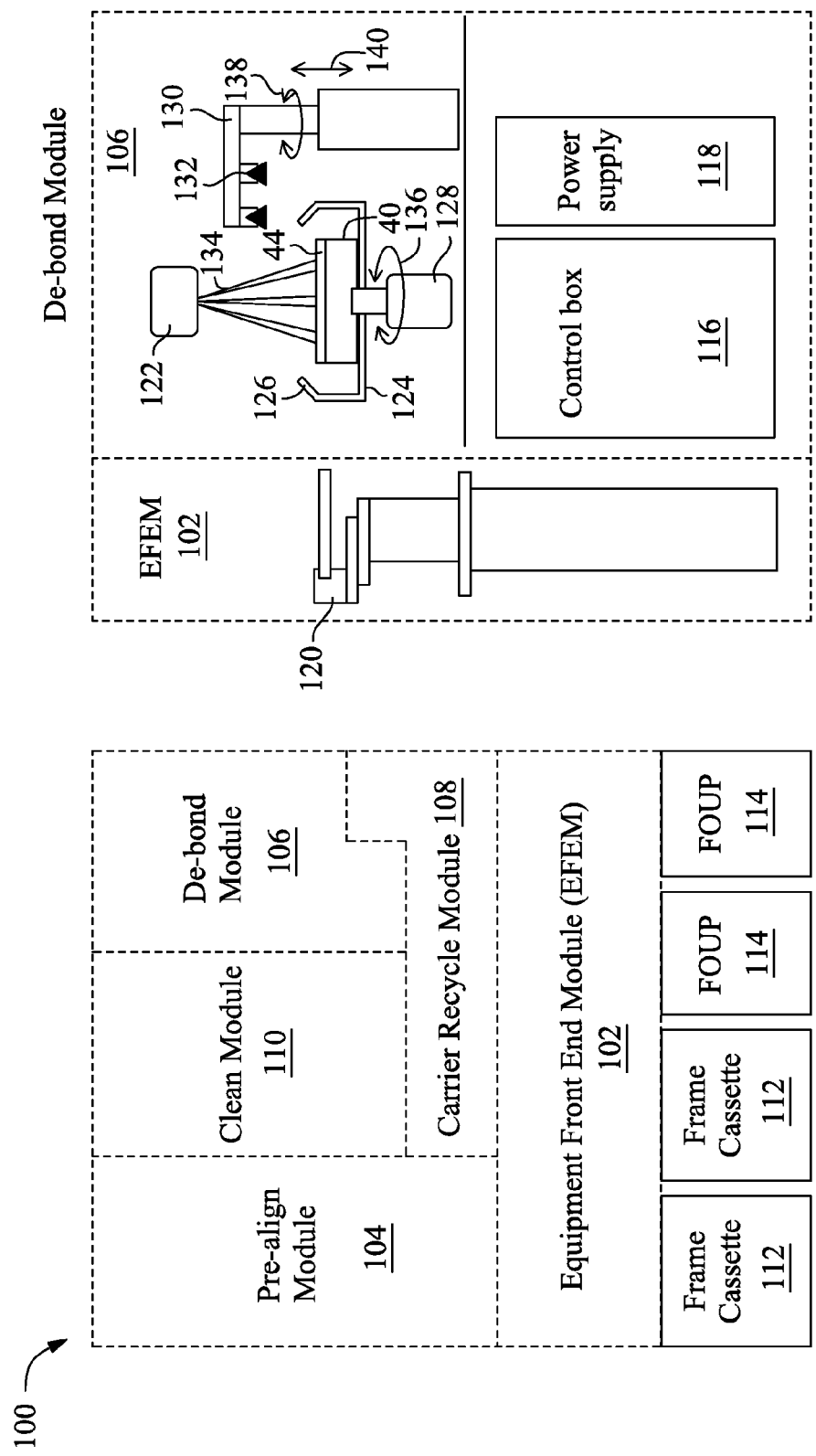
FIGS. 3A through 3C are views of a first tool for implementing a de-bonding and cleaning process in accordance with some embodiments.
Figure 3C:
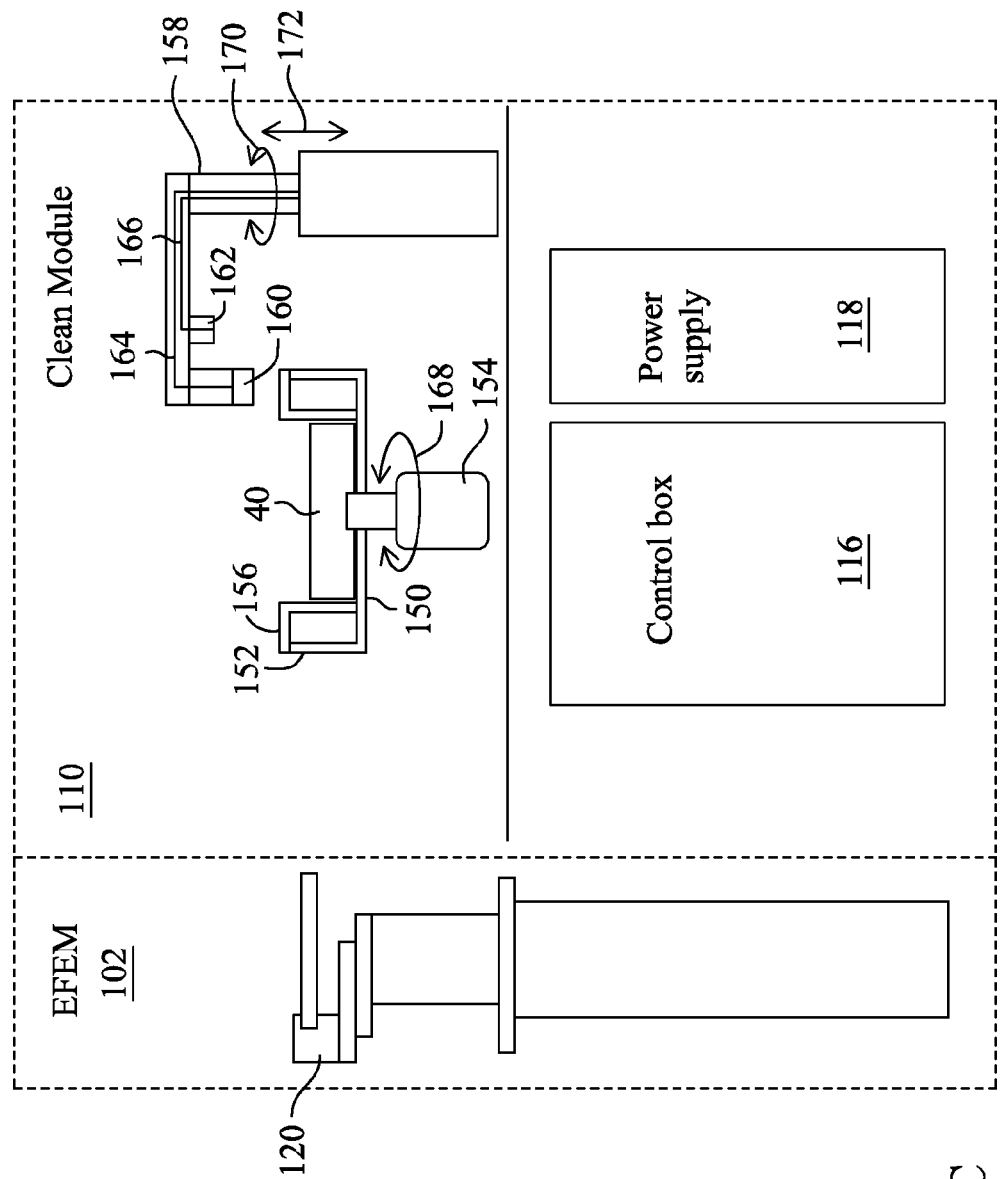

FIG. 3A illustrates a first tool 100 for implementing a de-bonding and cleaning process in accordance with some embodiments, and FIGS. 3B and 3C illustrate further aspects of modules of the tool 100 in FIG. 3A. The tool 100 comprises an Equipment Front End Module (EFEM) 102, a pre-alignment module 104, a de-bond module 106, a carrier recycle module 108, and a clean module 110. The tool 100 also comprises a control box 116 and a power supply 118. The control box 116 may comprise one or more electronic controllers and/or processors that control an automated process of the tool 100, such as in accordance with a recipe supplied by memory (e.g., a non-transitory medium) in the control box 116 or remote from the tool 100. The tool 100 may have one control box 116 to automate and control all of the tools and modules in the tool 100, or may have separate control boxes 116 to automate and control one or more of the modules in tool 100 and tools within the modules. The power supply 118 supplies an appropriate power to various components within the tool 100. The tool 100 may have one power supply 118 to provide power to all of the modules in the tool 100, or may have separate power supplies 118 to provide power to one or more of the modules in the tool 100. Frame cassettes 112 and Front Opening Unified Pods (FOUPs) 114 are illustrated coupled to the EFEM 102 of the tool 100.

The EFEM 102 comprises a transfer tool 120 that is capable of transferring substrates between modules and to and from frame cassettes 112 and FOUPs 114. The transfer tool 120 may comprise a robot arm, transfer guides, or the like. The transfer tools 120 may be controlled by an electronic controller and/or processor in a control box 116 such that the transfer of substrates is automated, such as in accordance with a recipe.

The pre-alignment module 104 comprises an alignment tool that is capable of aligning substrates appropriately for processing. A frame cassette 112 having the substrates to be de-bonded, e.g., the package substrate 40 and carrier substrate 44, is coupled to the EFEM 102. The transfer tool 120 in the EFEM 102 transfers the substrates 40 and 44 from a frame cassette 112 to the alignment tool in the pre-alignment module 104 where the substrates 40 and 44 are aligned for subsequent processing. The alignment tool, or further, the pre-alignment module 104, may be controlled by an electronic controller and/or processor in a control box 116 such that the alignment of substrates is automated, such as in accordance with a recipe.

Referring to FIGS. 3A and 3B, the de-bond module 106 comprises a radiation source 122, a chuck 124 with a frame 126, a motor 128, a robot arm 130, and a vacuum system 132. The chuck 124 with the frame 126 is configured to support a substrate, e.g., package substrate 40 and carrier substrate 44, during a de-bonding process. The motor 128 is configured to rotate 136 the chuck 124, and hence, a substrate on the chuck 124. The radiation source 122 is configured to emit radiation 134 toward a substrate on the chuck 124. The radiation source 122 can emit any appropriate radiation, such as IR light, UV light, or the like, in any acceptable form, such as laser or any acceptable exposure, that is capable of decomposing a release coating used to bond substrates 40 and 44. The vacuum system 132 is mounted on and/or integrated into the robot arm 130. The robot arm 130 is configured to rotate 138 and/or telescope 140 to position the vacuum system 132 in contact with the carrier substrate 44 once de-bonded and transfer the carrier substrate 44 to the transfer tool 120 of the EFEM 102. The vacuum system 132 is configured to provide a pressure differential, such as a vacuum, when in contact with the carrier substrate 44 sufficient to secure the carrier substrate 44 to the robot arm 130. Each of the tools and components in the de-bond module 106 may be controlled by an electronic controller and/or processor in a control box 116 such that the de-bonding and transferring of substrates is automated, such as in accordance with a recipe.

The de-bond module 106 may implement the process discussed with respect to FIGS. 2A through 2C. As in FIG. 2A, a package substrate 40 that is bonded to a carrier substrate 44 by a release coating is mounted on the chuck 124 and within the frame 126 using a tape (not shown). The transfer tool 120 of the EFEM 102 may transfer the substrates 40 and 44 from the pre-alignment module 104 and mount the substrates 40 and 44 on the chuck 124. Once mounted, the motor 128 may begin rotating 136 the chuck 124 and the substrates 40 and 44. The rotation 136 may facilitate a radiation 134 exposure, such as a laser scan. In other embodiments, no rotation of the chuck and substrates is needed, for example, if the scan is implemented solely by the radiation source 122 or if no scan is used, such as when an entire area exposure is used.

The radiation source 122 provides a radiation 134 directed at the substrates 44 and 40 for performing a de-bonding process, such as discussed above with respect to FIG. 2B. As discussed above, radiation 134 can scan through the carrier substrate 44 to at least the release coating to decompose the release coating, thereby de-bonding the carrier substrate 44 from the package substrate 40. Any acceptable de-bonding process may be used to decompose the release coating between the package substrate 40 and the carrier substrate 44. Once the release film is sufficiently decomposed, the motor 128 terminates rotation 136 of the chuck 124 and substrates 40 and 44, if rotation 136 was used during de-bonding.

After de-bonding, the robot arm 130 rotates 138 to position the vacuum system 132 directly over the carrier substrate 44, and then, telescopes 140 downwardly until the vacuum system 132 contacts the carrier substrate 44. The vacuum system 132 is turned on and/or the pressure differential is increased once the vacuum system 132 contacts the carrier substrate 44, thereby securing the carrier substrate 44. The robot arm 130 then telescopes 140 upwardly to separate the carrier substrate 44 from the package substrate 40. The robot arm 130 may then rotate 138 to a position that is not directly over the package substrate 40. The transfer tool 120 may then secure the carrier substrate 44, and the vacuum system 132 may release the carrier substrate 44. The transfer tool 120 then transfers the carrier substrate 44 to the carrier recycle module 108.

The carrier recycle module 108 may comprise any appropriate tools to recondition carrier substrates for subsequent re-use. For example, the carrier recycle module 108 may comprise an immersion tank into which carrier substrates are placed with appropriate solvents to remove particulates or residue, such as of the release coating from bonding with a package substrate. Once the carrier substrate 44 is appropriately reconditioned, the transfer tool 120 of the EFEM 102 transfers the carrier substrate 44 to a FOUP 114, which may then be detached and transferred to another tool to re-use the carrier substrate 44. The immersion tank, and/or any other tools of the carrier recycle module 108, may be controlled by an electronic controller and/or processor in a control box 116 such that the processes implemented in the carrier recycle module 108 are automated, such as in accordance with a recipe.

After de-bonding, residue of the release coating may remain on the package substrate 40, such as illustrated in FIG. 2C. The transfer tool 120 of the EFEM 102 transfers the package substrate 40 to the clean module 110 so that a cleaning process can be performed on the package substrate 40 to remove any residue and particulates.

Referring to FIGS. 3A and 3C, the clean module 110 comprises a chuck 150 with a frame 152, a motor 154, a cover ring 156, a robot arm 158, and a cleaning system. The chuck 150 with the frame 152 is configured to support a substrate, e.g., package substrate 40, during a cleaning process. The motor 154 is configured to rotate 168 the chuck 150, and hence, a substrate on the chuck 150.

Figure 5A:
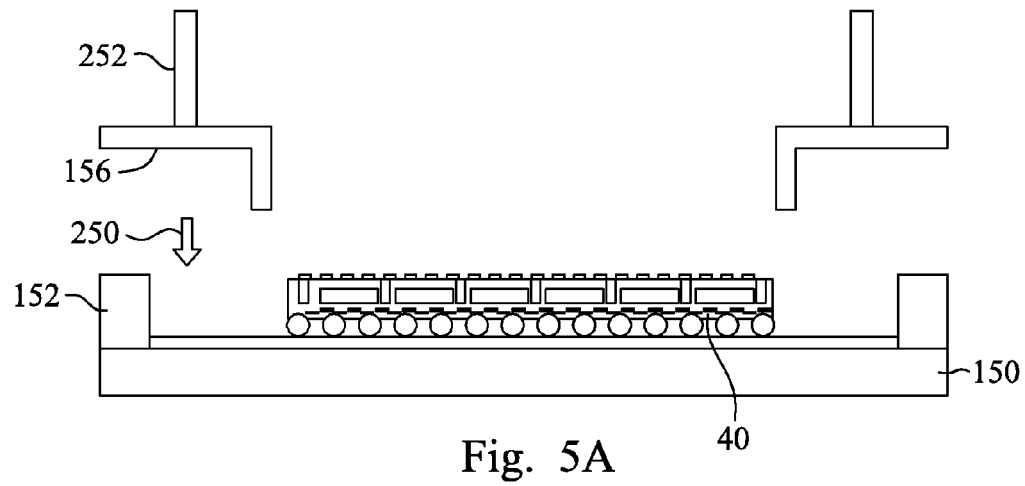
FIGS. 5A through 5C are views of an example configuration to place and remove a cover ring according to an embodiment.
Figure 5B:
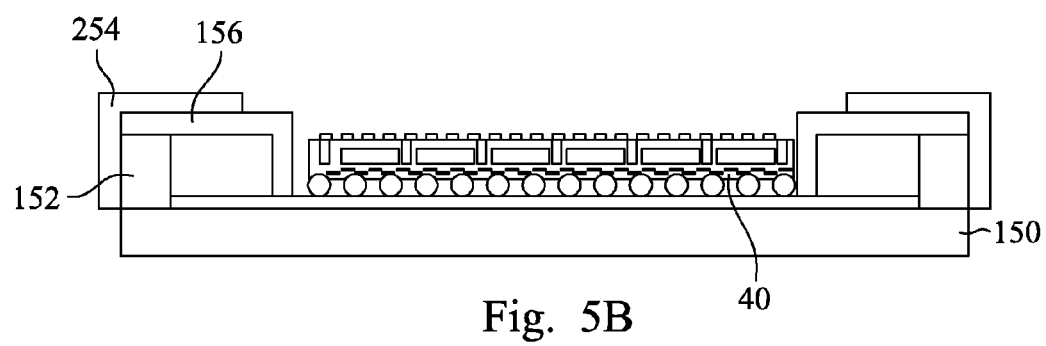
Figure 5C:
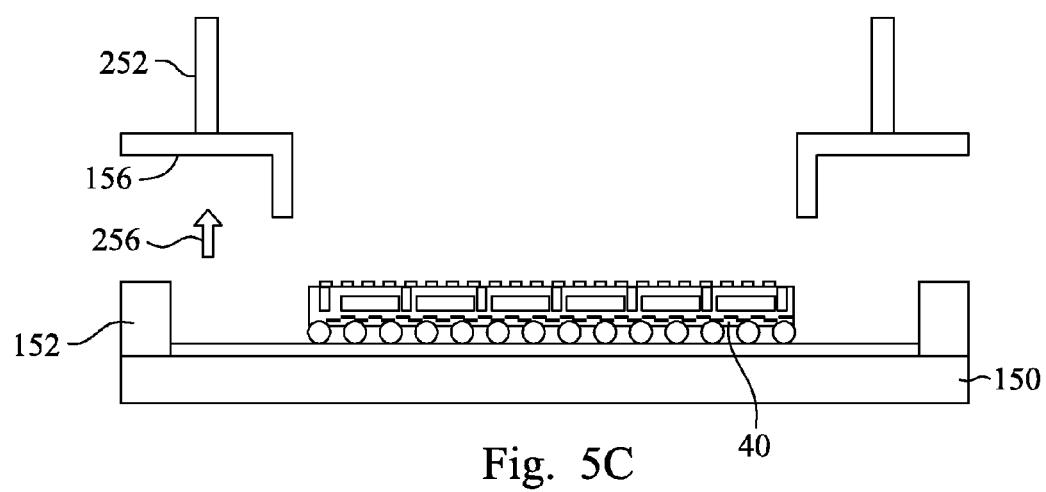

The cover ring 156 can be a separable component in the clean module 110 or can be attached to the frame 152, for example. In some embodiments, as shown in FIGS. 5A and 5B, the cover ring 156 is placed on the frame 152 and chuck 150 by a reciprocating arm 252 in the clean module 110. To place the cover ring 156, the reciprocating arm can extend out 250, such as downwardly from above the chuck 150, and place the cover ring 156 on the frame 152 where one or more clamps 254 can secure the cover ring 156 to the frame 152. As shown in FIGS. 5B and 5C, to remove the cover ring 156, the reciprocating arm 252 can extend out, secure the cover ring 156, and remove the cover ring 156 from the frame 152, such as by retracting 256 the reciprocating arm 252. In other embodiments, the cover ring 156 is attached to the frame 152, such as by a hinge mechanism. An example is shown in FIGS. 6A through 6F, where FIGS. 6A through 6C are cross sectional views, and FIGS. 6D through 6F are overhead views. The cover ring 156 can be in multiple separate portions 156a, with each portion 156a attached by a hinge mechanism to the frame 152. When the cover ring 156 is to be placed for use (e.g., or to be closed as shown in FIGS. 6B and 6E), each portion 156a can be rotated 260 by the hinge mechanism and/or a servo motor, for example, into place as shown in FIGS. 6A, 6B, 6D, and 6E. When the cover ring 156 is to be moved away (e.g., or to be opened as shown in FIGS. 6C and 6F), each portion 156a can be rotated 262 by the hinge mechanism and/or the servo motor, for example, away from the chuck 150 as shown in FIGS. 6C and 6F. Other configurations of the cover ring 156 may be used.

The cleaning system is mounted on and/or integrated into the robot arm 158. The cleaning system comprises a cleaning device 160, a spray nozzle 162, tubing 164 for supplying a fluid to the cleaning device 160, and tubing 166 for supplying a fluid to the spray nozzle 162. The cleaning device 160 can be a brush, a sponge, the like, or a combination thereof. A brush may include a base and bristles attached to the base. The bristles may be a flexible, comb-like configuration of material. Exemplary materials include PVA, mohair, sponge, fibers, cloth, nylon, rayon, polyester, polymer, or the like. A sponge may comprise a PVA sponge or the like. The fluid may be supplied through the tubing 164 and 166 from a tank or reservoir in the clean module 110 or from a location remote from the clean module 110. Although the spray nozzle 162 is illustrated as being on and/or integrated into the robot arm 158 in this embodiment, the spray nozzle 162 may be in a fixed location in the clean module 110 separate from the robot arm 158 or may be on a different robot arm separate from the cleaning device 160.

The robot arm 158 is configured to rotate 170 and/or telescope 172 to position the cleaning system in contact with the package substrate 40. The cleaning system is configured such that the cleaning device 160 can contact the package substrate 40 and the spray nozzle 162 can spray a fluid on the package substrate 40 during a cleaning process. Each of the tools and components in the clean module 110 may be controlled by an electronic controller and/or processor in a control box 116 such that the cleaning of substrates is automated, such as in accordance with a recipe.

The clean module 110 may implement the process discussed with respect to FIGS. 2D through 2G. As in FIG. 2D, a package substrate 40 is mounted on the chuck 150 and within the frame 152 using a tape (not shown). The transfer tool 120 of the EFEM 102 may transfer the package substrate 40 from the de-bond module 106 and mount the package substrate 40 on the chuck 150. Once mounted, the cover ring 156 is placed on the frame 152 and the chuck 150. The placing of the cover ring 156 may use the reciprocating arm or the rotation of cover ring portions to "close" the cover ring 152 as discussed above. Then, the motor 154 may begin rotating 168 the chuck 150 and the package substrate 40. The rotation 168 may facilitate cleaning. In other embodiments, no rotation of the chuck and package substrate is needed.

The robot arm 158 rotates 170 to position the cleaning system directly above the package substrate 40. The robot arm 158 then telescopes 172 downwardly until the cleaning device 160 contacts the package substrate 40. The cleaning device 160 can start at or proximate a center of the package substrate 40, and the robot arm 158 can rotate 170 towards an outer edge of the package substrate 40 while the motor 154 rotates the chuck 150 and the package substrate 40. In this manner, the cleaning device 160 may contact and clean substantially an entirety of a surface of the package substrate 40 (e.g., surface 80 in FIG. 2E). Once the cleaning device 160 reaches the outer edge of the package substrate 40, the robot arm 158 can telescope 172 upwardly and rotate 170 away from the package substrate 40. These actions of the cleaning device 160 contacting the package substrate 40 and passing over the package substrate 40 may be repeated any number of times. The cleaning device 160 may contact the package substrate 40 in different manners, and different techniques for passing the cleaning device over the package substrate 40 may be used.

Fluid may be supplied to the package substrate 40 in many different ways to facilitate the cleaning process. For example, once directly above the package substrate 40, the spray nozzle 162 can begin spraying a fluid, such as DI water IPA, or the like, supplied through tubing 166 onto the package substrate 40, such as illustrated in FIG. 2E. The fluid supplied through the tubing 166 and spray nozzle 162 may be sprayed only briefly upon initiation of contact of the cleaning device 160 with the package substrate 40, only throughout contact of the cleaning device 160 with the package substrate 40, throughout the contact and after contact of the cleaning device 160 with the package substrate 40, or any variation therebetween.

Once the robot arm 158 is clear of the package substrate 40 on the chuck 150, fluid, such as DI water or the like, may be supplied through tubing 164 onto the cleaning device 160 to rinse off any particulates that may have collected on the cleaning device 160 during cleaning from the cleaning device 160. Further, fluid supplied through tubing 164 and the cleaning device 160 may supplement fluid sprayed from the spray nozzle 162 during the cleaning process.

After the fluid being supplied to the package substrate 40 is turned off and the cleaning device 160 does not contact the package substrate 40, the motor 154 may continue to rotate 168 the chuck 150 and package substrate 40 (which may include increasing a rotational velocity) such that any fluid or loose particulates on the package substrate 40 may be removed by a centrifugal force of the rotation 168. The manner in which the package substrate 40 is cleaned, such as including how the cleaning device 160 contacts the package substrate 40 and how fluid is supplied through tubing 164 and 166, may be varied in many different ways, and the embodiments discussed herein are merely examples of how the cleaning may be performed.

Once rotation 168 of the chuck 150 ceases, the cover ring 156 is removed, such as by using the reciprocating arm or by rotating cover ring portions to "open" the cover ring 156. Then, the transfer tool 120 of the EFEM 102 transfers the package substrate 40 from the chuck 150 in the clean module 110 to a frame cassette 112. The frame cassette 112 can then be detached from the EFEM 102 of the tool 100 and taken to another tool for subsequent processing, such as sawing or dicing of the package substrate 40 into individual packages.

Figure 4A:
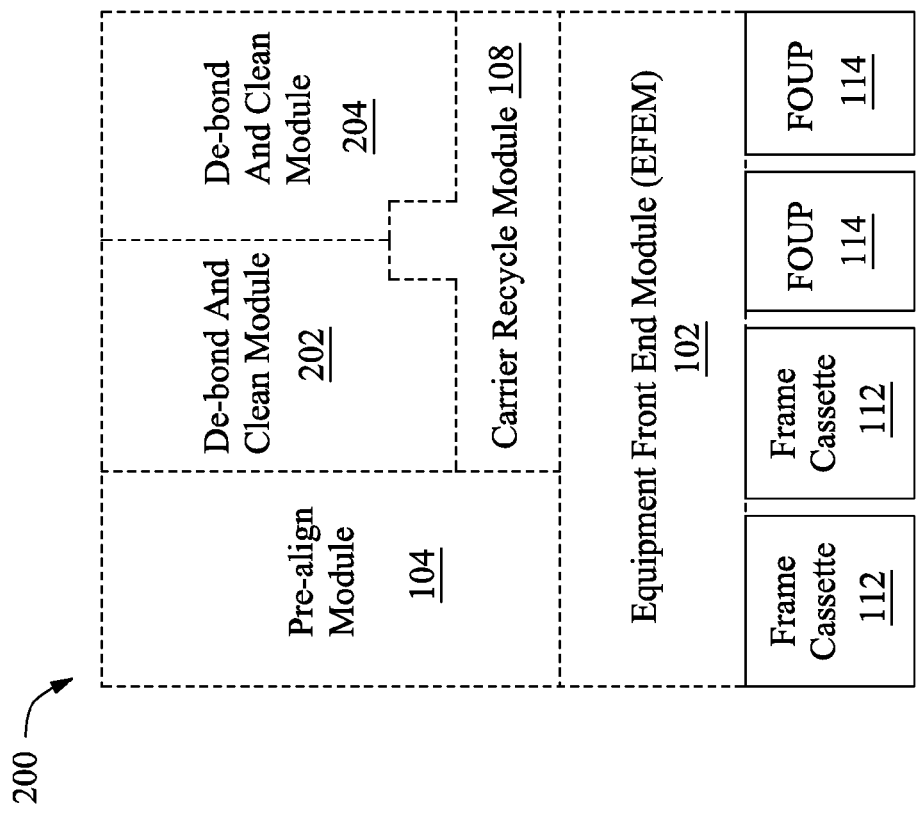
FIGS. 4A and 4B are views of a second tool for implementing a de-bonding and cleaning process in accordance with some embodiments.
Figure 4B:
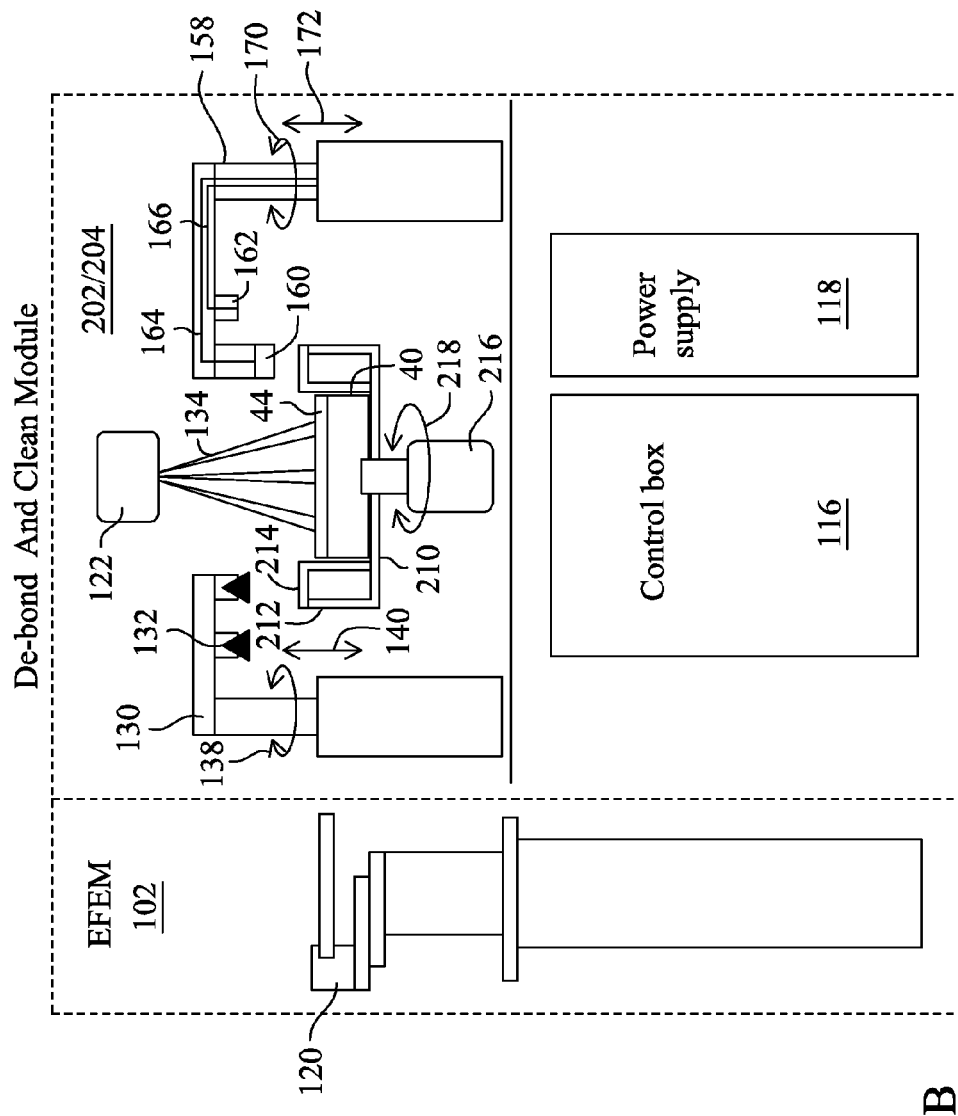

FIG. 4A illustrates a second tool 200 for implementing a de-bonding and cleaning process in accordance with some embodiments, and FIG. 4B illustrates further aspects of a module of the tool 200 in FIG. 4A. The tool 200 comprises many of the same modules as the tool 100 in FIG. 3A, including the EFEM 102, the pre-alignment module 104, and the carrier recycle module 108. These modules may comprise the same tools, function the same, and be controlled in the same manner as discussed above with respect to FIGS. 3A through 3B.

The tool 200 comprises de-bond and clean modules (DBCMs) 202 and 204. As illustrate in FIG. 4A, the tool 200 comprises two DBCMs 202 and 204, and other embodiments contemplate one DBCM or more DBCMs in a tool. Each DBCM 202 and 204 incorporates substantially all of the tools and functions of both a de-bond module 106 and a clean module 110 discussed above in FIGS. 3B and 3C. Each DBCM 202 and 204 comprises a radiation source 122, a robot arm 130, vacuum system 132, robot arm 158, cleaning device 160, spray nozzle 162, and tubing 164 and 166. These tools are configured the same, perform the same functions, and are controlled the same as discussed with respect to FIGS. 3B and 3C. Each DBCM 202 and 204 further comprises a chuck 210 with a frame 212, cover ring 214, and a motor 216. The chuck 210, frame 212, cover ring 214, and motor 216 are configured substantially the same, perform substantially the same functions, and are controlled substantially the same as the chucks 124 and 150 with frames 126 and 152, respectively, cover ring 156, and motors 128 and 154 discussed in FIGS. 3B and 3C, except without the need to transfer a package substrate between the de-bond module 106 and the clean module 110.

As with tool 100 in FIG. 3A, the transfer tool 120 in the EFEM 102 transfers the substrates 40 and 44 from a frame cassette 112 to the alignment tool in the pre-alignment module 104 where the substrates are aligned for subsequent processing.

Each DBCM 202 and 204 may implement the process discussed with respect to FIGS. 2A through 2G. As in FIG. 2A, a package substrate 40 that is bonded to a carrier substrate 44 by a release coating is mounted on the chuck 210 and within the frame 212 using a tape (not shown). The transfer tool 120 of the EFEM 102 may transfer the substrates 40 and 44 from the pre-alignment module 104 and mount the substrates on the chuck 210. Once mounted, the motor 216 may begin rotating 218 the chuck 210 and the substrates 40 and 44, if such rotation 218 is used.

The radiation source 122 provides radiation 134 directed at the substrates 44 and 40 for performing a de-bonding process, such as discussed above with respect to FIG. 2B and FIG. 3B. As previously discussed, any acceptable radiation may be used to decompose a release coating for de-bonding. Once the release film is sufficiently decomposed, the motor 216 terminates rotation 218 of the chuck 210 and substrates 40 and 44, if rotation 218 was used during de-bonding.

After de-bonding, the robot arm 130 rotates 138 to position the vacuum system 132 directly over the carrier substrate 44, and then, telescopes 140 downwardly until the vacuum system 132 contacts the carrier substrate 44. The vacuum system 132 is turned on and/or the pressure differential is increased once the vacuum system 132 contacts the carrier substrate 44, thereby securing the carrier substrate 44. The robot arm 130 then telescopes 140 upwardly to separate the carrier substrate 44 from the package substrate 40. The robot arm 130 may then rotate 138 to a position that is not directly over the package substrate 40. The transfer tool 120 may then secure the carrier substrate 44, and the vacuum system 132 may release the carrier substrate 44. The transfer tool 120 then transfers the carrier substrate 44 to the carrier recycle module 108, which may process the carrier substrate 44 as discussed above.

After de-bonding, residue of the release coating may remain on the package substrate 40, such as illustrated in FIG. 2C. A cleaning process is then performed in the DBCM 202 or 204 on the package substrate 40 to remove any residue and particulates. In this embodiment, the package substrate 40 remains secured to the chuck 210 for the subsequent cleaning process. The cover ring 214 is placed on the frame 212 and the chuck 210. The placing of the cover ring 214 may use a reciprocating arm or a rotation of cover ring portions to "close" the cover ring 214. The motor 216 may begin rotating 218 the chuck 210 and the package substrate 40. The rotation 218 may facilitate cleaning. In other embodiments, no rotation of the chuck and package substrate is needed.

The robot arm 158 rotates 170 to position the cleaning system directly above the package substrate 40. The robot arm 158 then telescopes 172 downwardly until the cleaning device 160 contacts the package substrate 40. The cleaning device 160 can start at or proximate a center of the package substrate 40, and the robot arm 158 can rotate 170 towards an outer edge of the package substrate 40 while the motor 216 rotates the chuck 210 and the package substrate 40. In this manner, the cleaning device 160 may contact and clean substantially an entirety of a surface of the package substrate 40 (e.g., surface 80 in FIG. 2E). Once the cleaning device 160 reaches the outer edge of the package substrate 40, the robot arm 158 can telescope 172 upwardly and rotate 170 away from the package substrate 40. These actions of the cleaning device 160 contacting the package substrate 40 and passing over the package substrate 40 may be repeated any number of times. The cleaning device 160 may contact the package substrate 40 in different manners, and different techniques for passing the cleaning device over the package substrate 40 may be used.

Fluid may be supplied to the package substrate 40 in many different ways to facilitate the cleaning process. For example, once directly above the package substrate 40, the spray nozzle 162 can begin spraying a fluid, such as DI water IPA, or the like, supplied through tubing 166 onto the package substrate 40, such as illustrated in FIG. 2E. The fluid from the spray nozzle 162 and tubing 166 may be dispensed or supplied as discussed above.

Once the robot arm 158 is clear of the package substrate 40 on the chuck 150, fluid, such as DI water or the like, may be supplied through tubing 164 onto the cleaning device 160 to rinse off any particulates that may have collected on the cleaning device 160 during cleaning from the cleaning device 160. Further, fluid supplied through tubing 164 and the cleaning device 160 may supplement fluid sprayed from the spray nozzle 162 during the cleaning process.

After the fluid being supplied to the package substrate 40 is turned off and the cleaning device 160 does not contact the package substrate 40, the motor 216 may continue to rotate 218 the chuck 210 and package substrate 40 (which may include increasing a rotational velocity) such that any fluid or loose particulates on the package substrate 40 may be removed by a centrifugal force of the rotation. The manner in which the package substrate 40 is cleaned, and the embodiments discussed herein are merely examples of how the cleaning may be performed.

Once rotation 218 of the chuck 210 ceases, the cover ring 214 is removed, such as by using the reciprocating arm or by rotating cover ring portions to "open" the cover ring 214. Then, the transfer tool 120 of the EFEM 102 transfers the package substrate 40 from the chuck 210 in the DBCM 202 or 204 to a frame cassette 112. The frame cassette 112 can then be detached from the EFEM 102 of the tool 200 and taken to another tool for subsequent processing, such as sawing or dicing of the package substrate 40 into individual packages.

Embodiments may achieve advantages. Using a frame-type chuck in the de-bonding process can increase the process stability, which can increase a yield of manufactured packages. Hence, processing for packages may become more robust. Additionally, using a cover ring during cleaning can help avoid particulate contamination or pollution of the tape on which the package substrate is secured. Further, integrating the de-bonding and cleaning processes into a single tool, which may be fully automated, can reduce space needed for such tools on a manufacturing floor, and can reduce labor costs. Even further, by using a physical clean process, such as with a cleaning device, harsh chemical solvents may be avoided, which can result in the cleaning process being greener or more environmentally friendly.

According to an embodiment, a method comprises de-bonding a surface of a first substrate from a second substrate, and after de-bonding, cleaning the surface of the first substrate. The cleaning comprises physically contacting a cleaning mechanism to the surface of the first substrate.

According to another embodiment, a method comprises providing a package substrate bonded to a carrier substrate by a release coating, the release coating being on a surface of the package substrate; decomposing the release coating and separating the carrier substrate from the package substrate; and after separating the carrier substrate from the package substrate, cleaning the surface of the package substrate. The cleaning includes supplying a fluid to the surface of the package substrate and contacting the surface of the package substrate with a cleaning mechanism to physically remove residue of the release coating from the surface of the package substrate.

Another embodiment is a tool. The tool comprises a de-bonding module and a cleaning module. The de-bonding module comprises a first chuck, a radiation source configured to emit radiation toward the first chuck, and a first robot arm having a vacuum system. The vacuum system is configured to secure and remove a substrate from the first chuck. The cleaning module comprises a second chuck, a spray nozzle configured to spray a fluid toward the second chuck, and a second robot arm having a cleaning device configured to physically contact the cleaning device to a substrate on the second chuck.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    de-bonding a surface of a first substrate from a second substrate, the first substrate being attached to a tape, the tape being attached to a frame, the frame being on a same side of the tape as the first substrate;
    after de-bonding the first substrate, placing a cover ring over a portion of the tape and over an upper surface of the frame, the cover ring encircling the first substrate; and
    after de-bonding, cleaning the surface of the first substrate, the cleaning comprising physically contacting a cleaning mechanism to the surface of the first substrate, wherein during the cleaning the surface, the cover ring covers the tape.

2. The method of claim 1, wherein the de-bonding comprises decomposing a release coating on the surface of the first substrate and between the first substrate and the second substrate, a residue of the release coating remaining on the surface after the de-bonding, the cleaning mechanism physically removing the residue during the cleaning the surface.

3. The method of claim 1, wherein the cleaning mechanism comprises a sponge.

4. The method of claim 1, wherein the cleaning mechanism comprises a brush.

5. The method of claim 1, wherein the cleaning the surface of the first substrate comprises supplying a fluid to the surface of the first substrate.

6. The method of claim 5, wherein the fluid comprises deionized water.

7. The method of claim 5, wherein the fluid comprises isopropyl alcohol.

8. The method of claim 1, further comprising clamping the cover ring to the frame using a clamp, the clamp extending over a portion of the cover ring.

9. A method comprising:
    providing a package substrate bonded to a carrier substrate by a release coating, the release coating being on a surface of the package substrate;
    placing the package substrate on a tape, the package substrate being interposed between the carrier substrate and the tape, the tape being held by a frame;
    decomposing the release coating and separating the carrier substrate from the package substrate;

after separating the carrier substrate from the package substrate, placing the package substrate in a cleaning module;

after placing the package substrate in the cleaning module, placing a cover ring over a portion of the tape adjacent the package substrate, the cover ring extending over at least a portion of an upper surface of the frame; and cleaning the surface of the package substrate, the cleaning including supplying a fluid to the surface of the package substrate and contacting the surface of the package substrate with a cleaning mechanism to physically remove residue of the release coating from the surface of the package substrate.

10. The method of claim 9, wherein the fluid comprises deionized water, isopropyl alcohol, or a combination thereof.

11. The method of claim 9, wherein the cleaning mechanism comprises a brush, a sponge, or a combination thereof.

12. The method of claim 9, wherein during the cleaning, the cover ring covers portions of the tape that the package substrate is not on during the cleaning.

13. The method of claim 9, wherein the decomposing the release coating comprises using a laser light scan.

14. A tool comprising:
a de-bonding module comprising:
a first chuck,
a radiation source configured to emit radiation toward the first chuck, and
a first robot arm having a vacuum system, the vacuum system configured to secure and remove a substrate from the first chuck; and
a cleaning module comprising:
a second chuck,
a frame attached to the second chuck,
a cover ring attached to the frame, the cover ring being configured to encircle the substrate on the second chuck and to cover at least a portion of the second chuck and to cover an upper surface of the frame,
a spray nozzle configured to spray a fluid toward the second chuck, and
a second robot arm having a cleaning device configured to physically contact the cleaning device to a substrate on the second chuck.

15. The tool of claim 14, wherein the de-bonding module and the cleaning module are part of a same module, the first chuck and the second chuck being a same chuck.

16. The tool of claim 14, wherein the de-bonding module and the cleaning module are separate modules.

17. The tool of claim 14 further comprising a transfer tool configured to transfer a substrate between modules.

18. The tool of claim 14, wherein the spray nozzle is on the second robot arm.

19. The tool of claim 14, wherein the cleaning module comprises a motor configured to rotate the second chuck.

20. The tool of claim 14, wherein the cleaning module further comprises a clamp extending over the cover ring configured to secure the cover ring during processing.

* * * * *